(12) United States Patent
Sun

(10) Patent No.: US 8,704,101 B2
(45) Date of Patent: Apr. 22, 2014

(54) PACKAGE CARRIER AND MANUFACTURING METHOD THEREOF

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 108 days.

(21) Appl. No.: 13/539,505

(22) Filed: Jul. 2, 2012

(65) Prior Publication Data

US 2013/0269986 A1 Oct. 17, 2013

(30) Foreign Application Priority Data

Apr. 13, 2012 (TW) .............................. 101113270 A

(51) Int. Cl.
*H05K 1/00* (2006.01)
*H05K 1/11* (2006.01)
*H05K 1/18* (2006.01)

(52) U.S. Cl.
USPC ........... 174/252; 174/261; 174/262; 361/761; 361/763; 361/764

(58) Field of Classification Search
CPC . H05K 1/0204; H05K 1/0203; H05K 1/0206; H05K 1/021; H05K 1/0201; H05K 7/205; H05K 7/20; H05K 3/30; H01L 23/12
USPC ................. 174/250, 252, 257, 260, 261, 262, 174/264–266; 361/760, 761, 763, 764, 361/709–712
See application file for complete search history.

(56) References Cited

U.S. PATENT DOCUMENTS

| 6,861,750 B2 * | 3/2005 | Zhao et al. ..................... 257/739 |
| 2003/0169575 A1 * | 9/2003 | Ikuta et al. ..................... 361/761 |
| 2006/0011383 A1 * | 1/2006 | Noguchi ....................... 174/255 |
| 2008/0273313 A1 * | 11/2008 | Wang et al. ................... 361/761 |
| 2010/0006330 A1 * | 1/2010 | Fu et al. ........................ 174/260 |

FOREIGN PATENT DOCUMENTS

| TW | M308623 | 3/2007 |
| TW | 201110836 | 3/2011 |
| TW | 201112888 | 4/2011 |
| TW | M422157 | 2/2012 |

OTHER PUBLICATIONS

"Office Action of Taiwan Counterpart Application", issued on Sep. 26, 2013, p. 1-p. 9.

* cited by examiner

*Primary Examiner* — Hoa C Nguyen
(74) *Attorney, Agent, or Firm* — Jianq Chyun IP Office

(57) ABSTRACT

In a manufacturing method of a package carrier, a substrate having an upper surface, a lower surface, and an opening communicating the two surfaces is provided. An electronic device is disposed inside the opening. A first insulation layer and a superimposed first metal layer are laminated on the upper surface; a second insulation layer and a superimposed second metal layer are laminated on the lower surface. The opening is filled with the first and second insulation layers. First blind holes, second blind holes, and a heat-dissipation channel are formed. A third metal layer is formed on the first and second blind holes and an inner wall of the heat-dissipation channel. A heat-conducting device is disposed inside the heat-dissipation channel and fixed into the heat-dissipation channel via an insulation material. The first and second metal layers are patterned to form a first patterned metal layer and a second patterned metal layer.

10 Claims, 8 Drawing Sheets

PACKAGE CARRIER AND MANUFACTURING METHOD THEREOF

CROSS-REFERENCE TO RELATED APPLICATION

This application claims the priority benefit of Taiwan application serial no. 101113270, filed on Apr. 13, 2012. The entirety of the above-mentioned patent application is hereby incorporated by reference herein and made a part of this specification.

BACKGROUND OF THE INVENTION

1. Field of the Invention

The invention relates to a package structure and a manufacturing method thereof. More particularly, the invention relates to a package carrier and a manufacturing method thereof.

2. Description of Related Art

In recent years, as the electronic technology advances at every moment and the high-tech electronic industry continues burgeoning, electronic products have been developing toward the trend of fast processing speed, multi-functionality, high density, compactness, and low prices. A package carrier is often configured in the electronic product. The package carrier not only has conductive circuits but also carries electronic devices including a capacitor, an inductor, a resistor, or an IC chip, such that the package carrier may serve as a data processing unit of the electronic product. Nonetheless, if the electronic devices are all configured on the package carrier, the area occupied by the electronic devices may increase, the layout space may decrease, and the miniaturization requirement for the existing electronic products may not be satisfied.

From another perspective, a normal package carrier is mainly constituted by a plurality of patterned conductive layers and at least one insulation layer, and the insulation layer is configured between two adjacent patterned conductive layers for electrical insulation. To improve the heat dissipation performance of the package carrier, heat-dissipation blocks are frequently fixed onto a lower surface of the package carrier via an adhesion layer; thereby, heat generated by the electronic devices configured on the package carrier may be transmitted to the heat-dissipation blocks through the patterned conductive layers and the insulation layer and may then be dissipated. Due to the unfavorable heat conductivity of the adhesion layer and the insulation layer, the thermal resistance may increase when the heat generated by the electronic devices is transmitted to the heat-dissipation blocks through the insulation layer and the adhesion layer, which leads to difficulty in heat dissipation. Hence, how to embed some of the electronic devices in the package carrier to reduce the thickness of the package carrier and expand the layout space and how to efficiently dissipate heat generated by the electronic devices to the external surroundings have become a focus to researchers and designers in this field.

SUMMARY OF THE INVENTION

The invention is directed to a package carrier with favorable heat-dissipation performance and small package thickness.

The invention is directed to a manufacturing method of a package carrier for manufacturing said package carrier.

In an embodiment of the invention, a manufacturing method of a package carrier is provided. In the manufacturing method, a substrate is provided. The substrate has an upper surface, a lower surface opposite to the upper surface, and an opening communicating the upper surface and the lower surface. An electronic device is configured inside the opening of the substrate, and the electronic device has a top surface and a bottom surface opposite to each other. A first insulation layer and a superimposed first metal layer are laminated on the upper surface of the substrate, and a second insulation layer and a superimposed second metal layer are laminated on the lower surface of the substrate. Here, the opening is filled with the first insulation layer and the second insulation layer. A plurality of first blind holes, a plurality of second blind holes, and a heat-dissipation channel are formed. The first blind holes extend from the first metal layer to the first insulation layer and expose a portion of the top surface of the electronic device. The second blind holes extend from the second metal layer to the second insulation layer and expose a portion of the bottom surface of the electronic device. The heat-dissipation channel penetrates the first metal layer, the first insulation layer, the substrate, the second insulation layer, and the second metal layer. A third metal layer is formed on the first blind holes, the second blind holes, and an inner wall of the heat-dissipation channel. A heat-conducting device is configured inside the heat-dissipation channel, and the heat-conducting device is fixed into the heat-dissipation channel via an insulation material. The insulation material is located between the heat-conducting device and a portion of the third metal layer located on the inner wall of the heat-dissipation channel. The first metal layer and the second metal layer are patterned to form a first patterned metal layer and a second patterned metal layer.

According to an embodiment of the invention, after patterning the first metal layer and the second metal layer, the manufacturing method further includes: forming a solder mask layer on a portion of the first patterned metal layer, a portion of the first insulation layer exposed by the first patterned metal layer, a portion of the second patterned metal layer, and a portion of the second insulation layer exposed by the second patterned metal layer; forming a surface passivation layer to cover a portion of the first patterned metal layer, a portion of the second patterned metal layer, the third metal layer, the insulation material, and the heat-conducting device.

According to an embodiment of the invention, the substrate includes a first copper foil layer, a second copper foil layer, and a core dielectric layer. The core dielectric layer is disposed between the first copper foil layer and the second copper foil layer.

According to an embodiment of the invention, a material of the heat-conducting device includes ceramics, silicon, silicon carbide, diamond, or metal.

According to an embodiment of the invention, the electronic device includes a radio frequency (RF) device, an active device, or a passive device.

According to an embodiment of the invention, a method of forming the third metal layer includes plating.

In an embodiment of the invention, a package carrier that includes a substrate, an electronic device, a first insulation layer, a first patterned metal layer, a second insulation layer, a second patterned metal layer, a heat-dissipation channel, a third metal layer, and a heat-conducting device is provided. The substrate has an upper surface, a lower surface opposite to the upper surface, and an opening communicating the upper surface and the lower surface. The electronic device is configured inside the opening of the substrate, and the electronic device has a top surface and a bottom surface opposite to each other. The first insulation layer is disposed on the upper surface of the substrate and fills the opening. Here, the first insulation layer has a plurality of first blind holes, and the first blind holes expose a portion of the top surface of the electronic device. The first patterned metal layer is disposed on the first insulation layer and exposes a portion of the first insulation layer. The second insulation layer is disposed on the lower surface of the substrate and fills the opening. Here, the second insulation layer has a plurality of second blind holes, and the second blind holes expose a portion of the bottom surface of the electronic device. The second patterned metal layer is disposed on the second insulation layer and exposes a portion of the second insulation layer. The heat-dissipation channel penetrates the first insulation layer, the first patterned metal layer, the substrate, the second patterned metal layer, and the second insulation layer. The third metal layer fills the first blind holes and the second blind holes and covers an inner wall of the heat-dissipation channel. Here, the third metal layer connects the first patterned metal layer and the second patterned metal layer. The heat-conducting device is disposed inside the heat-dissipation channel.

According to an embodiment of the invention, the package carrier further includes a solder mask layer and a surface passivation layer. The solder mask layer is disposed on a portion of the first patterned metal layer, the portion of the first insulation layer exposed by the first patterned metal layer, a portion of the second patterned metal layer, and the portion of the second insulation layer exposed by the second patterned metal layer. The surface passivation layer covers a portion of the first patterned metal layer, a portion of the second patterned metal layer, the third metal layer, and the heat-conducting device.

According to an embodiment of the invention, a material of the heat-conducting device includes ceramics, silicon, silicon carbide, diamond, or metal.

According to an embodiment of the invention, the electronic device includes an RF device, an active device, or a passive device.

Based on the above, the package carrier described herein has the heat-conducting device, and the heat-conducting device is embedded in the substrate. Therefore, when a heat-generating device is configured on the package carrier, heat generated by the heat-generating device may be rapidly transmitted to external surroundings through the heat-conducting device, so as to effectively dissipate the heat generated by the heat-generating device and further improve efficiency and extend the life span of the heat-generating device. Moreover, the electronic device provided in an embodiment of the invention is embedded in the substrate, and thus the package carrier described herein may have small package thickness and large layout space.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1A:
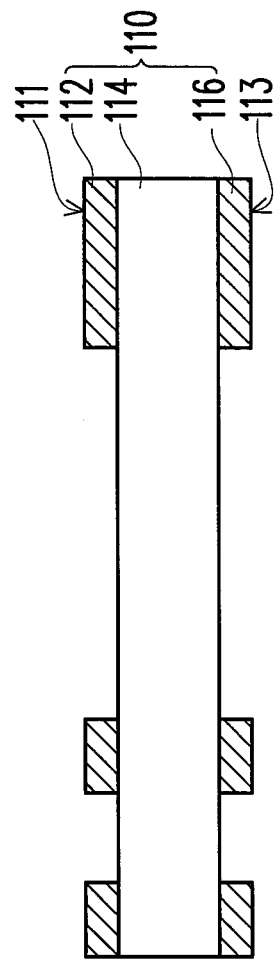
FIG. 1A to FIG. 1G are schematic cross-sectional views illustrating a manufacturing method of a package carrier according to an embodiment of the invention.
Figure 1A:
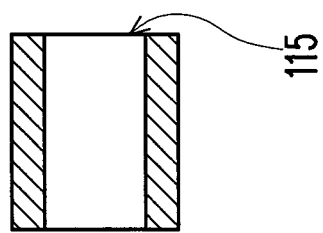

FIG. 1A to FIG. 1G are schematic cross-sectional views illustrating a manufacturing method of a package carrier according to an embodiment of the invention. As shown in FIG. 1A, in the manufacturing method of the package carrier according to the present embodiment, a substrate 110 is provided. The substrate 110 has an upper surface 111, a lower surface 113 opposite to the upper surface 111, and an opening 115 communicating the upper surface 111 and the lower surface 113. According to the present embodiment, the substrate 110 is composed of a first copper foil layer 112, a core dielectric layer 114, and a second copper foil layer 116, for instance, and the core dielectric layer 114 is disposed between the first copper foil layer 112 and the second copper foil layer 116. That is, the substrate 110 described in the present embodiment is a double-sided board. Certainly, in other embodiments, the substrate 110 may be a multi-layer board or a glass fiber (FR4) substrate. The type of the substrate 110 is not limited herein. Besides, a method of forming the opening 115 is punching or routing, for instance.

Figure 1B:
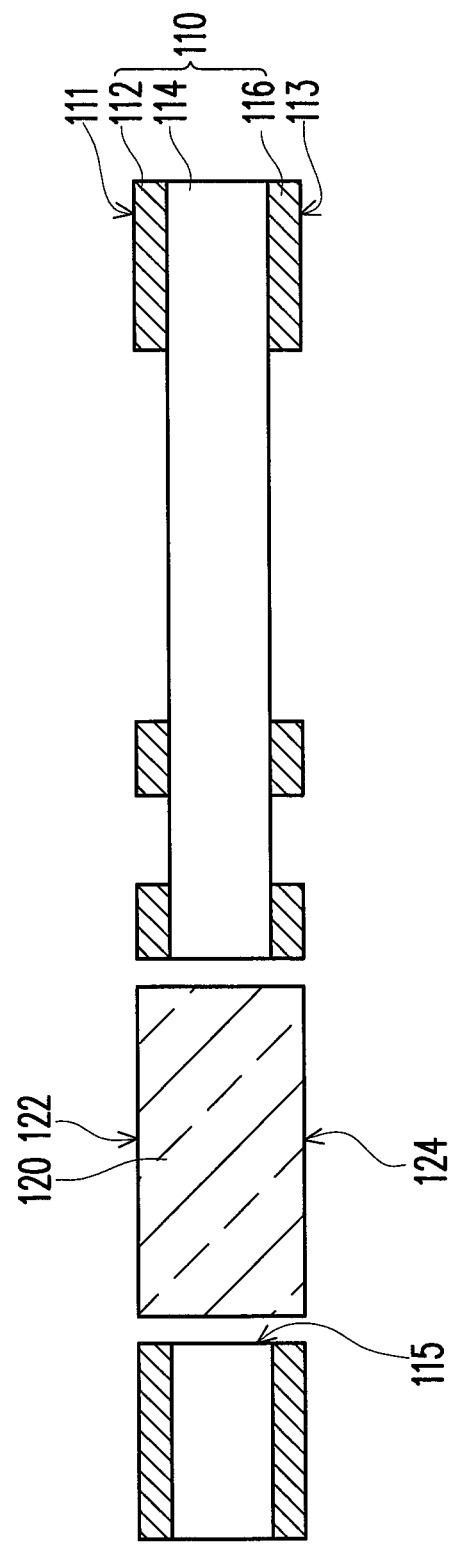

With reference to FIG. 1B, an electronic device 120 is configured inside the opening 115 of the substrate 110, and the diameter of the opening 115 of the substrate 110 is greater than the diameter of the electronic device 120. The electronic device 120 has a top surface 122 and a bottom surface 124 opposite to each other, and the electronic device 120 may be temporarily fixed into the opening 115 via an adhesive (not shown) located on the lower surface 113 of the substrate 110. Here, the electronic device 120 is, for instance, an RF device, an active device, a passive device, a memory, or an electronic connector. The diameter of the opening 115 of the substrate 110 is greater than the diameter of the electronic device 120. Hence, when the electronic device 120 is disposed inside the opening 115 of the substrate 110, favorable process window can be guaranteed.

Figure 1C:
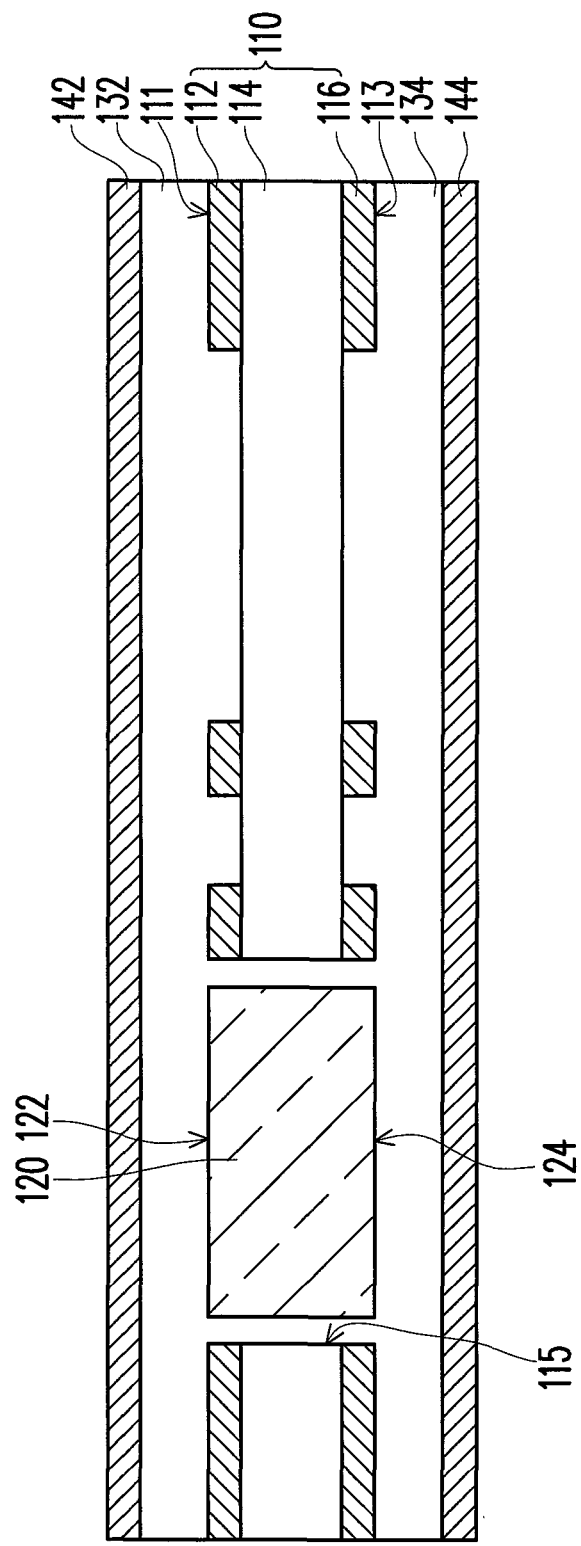

With reference to FIG. 1C, a first insulation layer 132 and a superimposed first metal layer 142 (on the first insulation layer 132) are laminated on the upper surface 111 of the substrate 110, and a second insulation layer 134 and a superimposed second metal layer 144 (on the second insulation layer 134) are laminated on the lower surface 113 of the substrate 110. In the present embodiment, a method of laminating the first insulation layer 132 and the superimposed first metal layer 142 on the upper surface 111 of the substrate 110 and laminating the second insulation layer 134 and the superimposed second metal layer 144 on the lower surface 113 of the substrate 110 is, for instance, thermal lamination. Besides, a material of the first insulation layer 132 and the second insulation layer 134 is, for instance, polyimide (PI) or epoxy resin.

In the present embodiment, the first insulation layer 132 and the second insulation layer 134 are respectively laminated on the upper surface 111 and the lower surface 113 of the substrate 110 through thermal lamination. Accordingly, a portion of the first insulation layer 132 and a portion of the second insulation layer 134 extend to the opening 115, and the opening 115 is filled with the first insulation layer 132 and the second insulation layer 134. Thereby, the electronic device 120 is fixed into the opening 115, as depicted in FIG. 1C. It should be mentioned that the adhesive (not shown) applied to temporarily fix the electronic device 120 into the opening 115 may be removed after laminating the first insulation layer 132 and the first metal layer 142 on the upper surface 111 of the substrate 110 and before laminating the second insulation layer 134 and the second metal layer 144 on the lower surface 113 of the substrate 110.

Figure 1D:
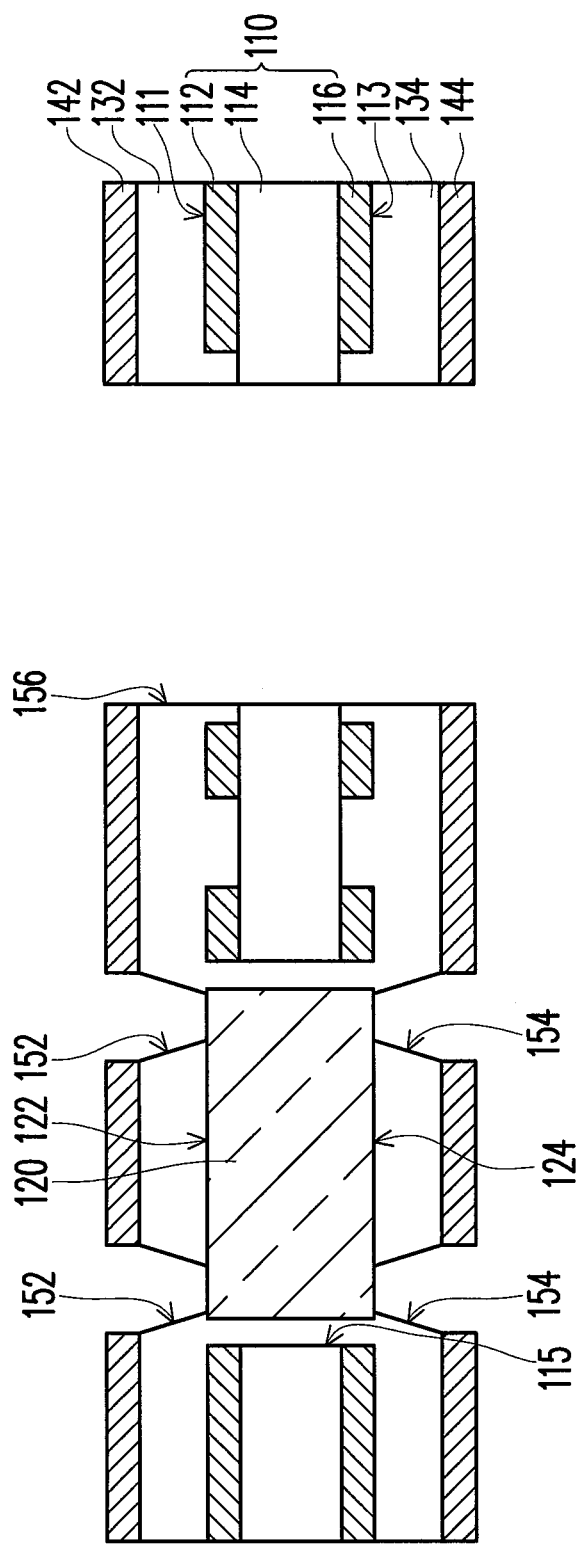

With reference to FIG. 1D, a plurality of first blind holes 152, a plurality of second blind holes 154, and a heat-dissipation channel 156 are formed. Particularly, the first blind holes 152 extend from the first metal layer 142 to the first insulation layer 132 and expose a portion of the top surface 122 of the electronic device 120. The second blind holes 154 extend from the second metal layer 144 to the second insulation layer 134 and expose a portion of the bottom surface 124 of the electronic device 120. The heat-dissipation channel 156 penetrates the first metal layer 142, the first insulation layer 132, the substrate 110, the second insulation layer 134, and the second metal layer 144. In the present embodiment, a method of forming the first blind holes 152, the second blind holes 154, and the heat-dissipation channel 156 is mechanical drilling or laser drilling, for instance.

Figure 1E:
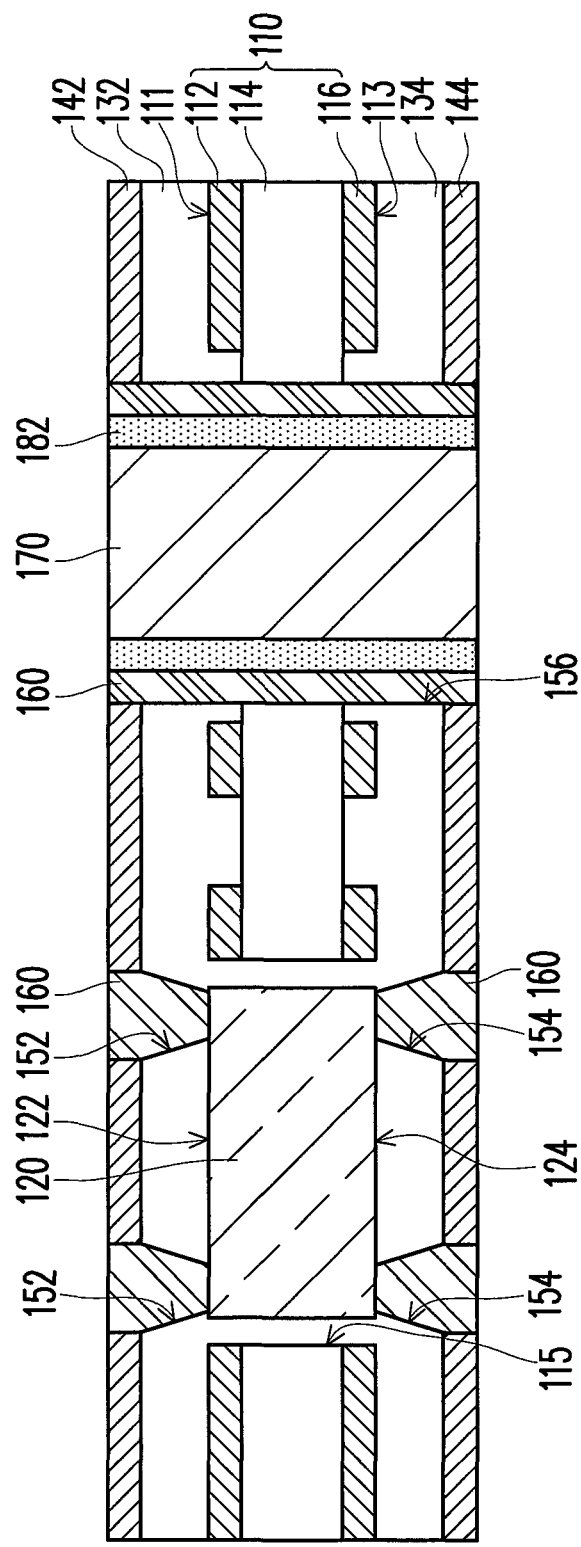

With reference to FIG. 1E, a third metal layer 160 is formed on the first blind holes 152, the second blind holes 154, and an inner wall of the heat-dissipation channel 156 by plating, for instance. According to the present embodiment, the first blind holes 152 and the second blind holes 154 are filled with the third metal layer 160, and the third metal layer 160 covers the inner wall of the heat-dissipation channel 156. The third metal layer 160 connects the first metal layer 142 and the second metal layer 144. Here, one surface of the third metal layer 160 may be substantially aligned to a surface of the first metal layer 142, or the surface level of the third metal layer 160 may be slightly lower than the surface of the first metal layer 142. Besides, the other surface of the third metal layer 160 may be substantially aligned to a surface of the second metal layer 144, or the surface level of the third metal layer 160 may be slightly lower than the surface of the second metal layer 144.

As illustrated in FIG. 1E, a heat-conducting device 170 is configured inside the heat-dissipation channel 156, and the heat-conducting device 170 is fixed into the heat-dissipation channel 156 via an insulation material 182. The insulation material 182 is located between the heat-conducting device 170 and a portion of the third metal layer 160 located on the inner wall of the heat-dissipation channel 156. A material of the heat-conducting device 170 is ceramics, silicon, silicon carbide, diamond, or metal, for instance. The insulation material 182 is, for instance, resin, epoxy resin, or a paste-like material.

Figure 1F:
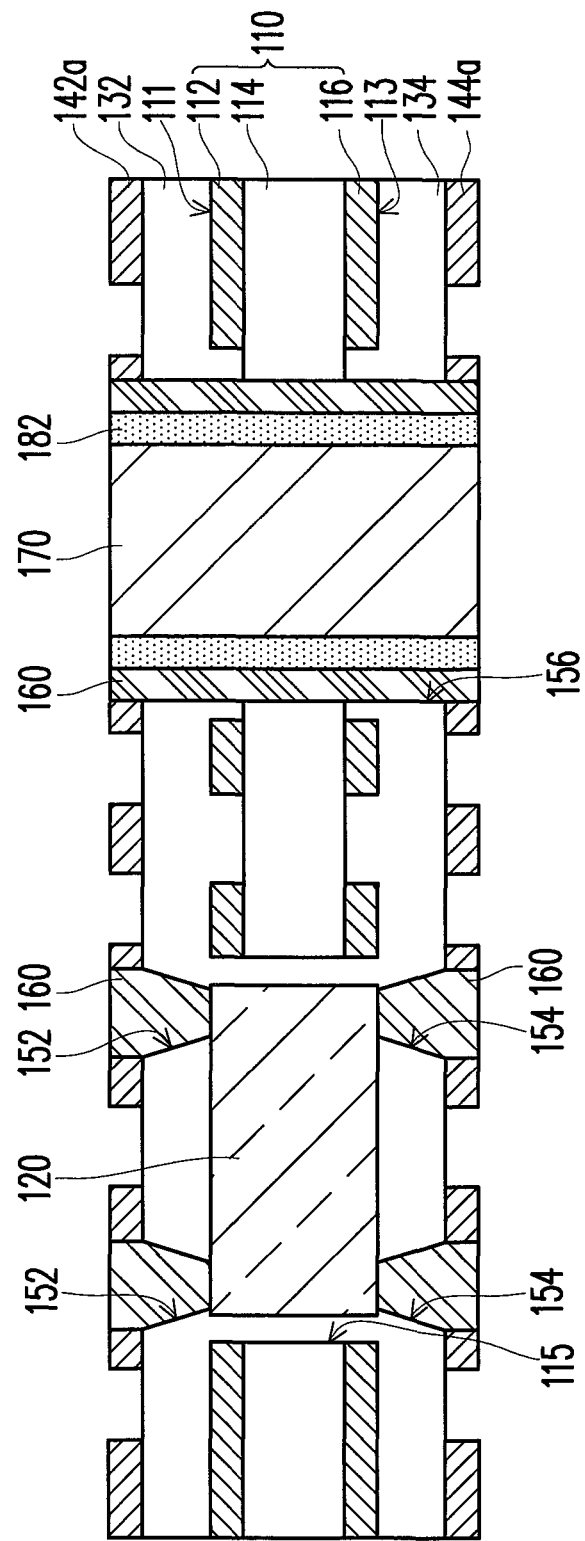

With reference to FIG. 1F, the first metal layer 142 and the second metal layer 144 are patterned to form a first patterned metal layer 142a and a second patterned metal layer 144a. In the present embodiment, the first patterned metal layer 142a exposes a portion of the first insulation layer 132, and the second patterned metal layer 144a exposes a portion of the second insulation layer 134.

Figure 1G:
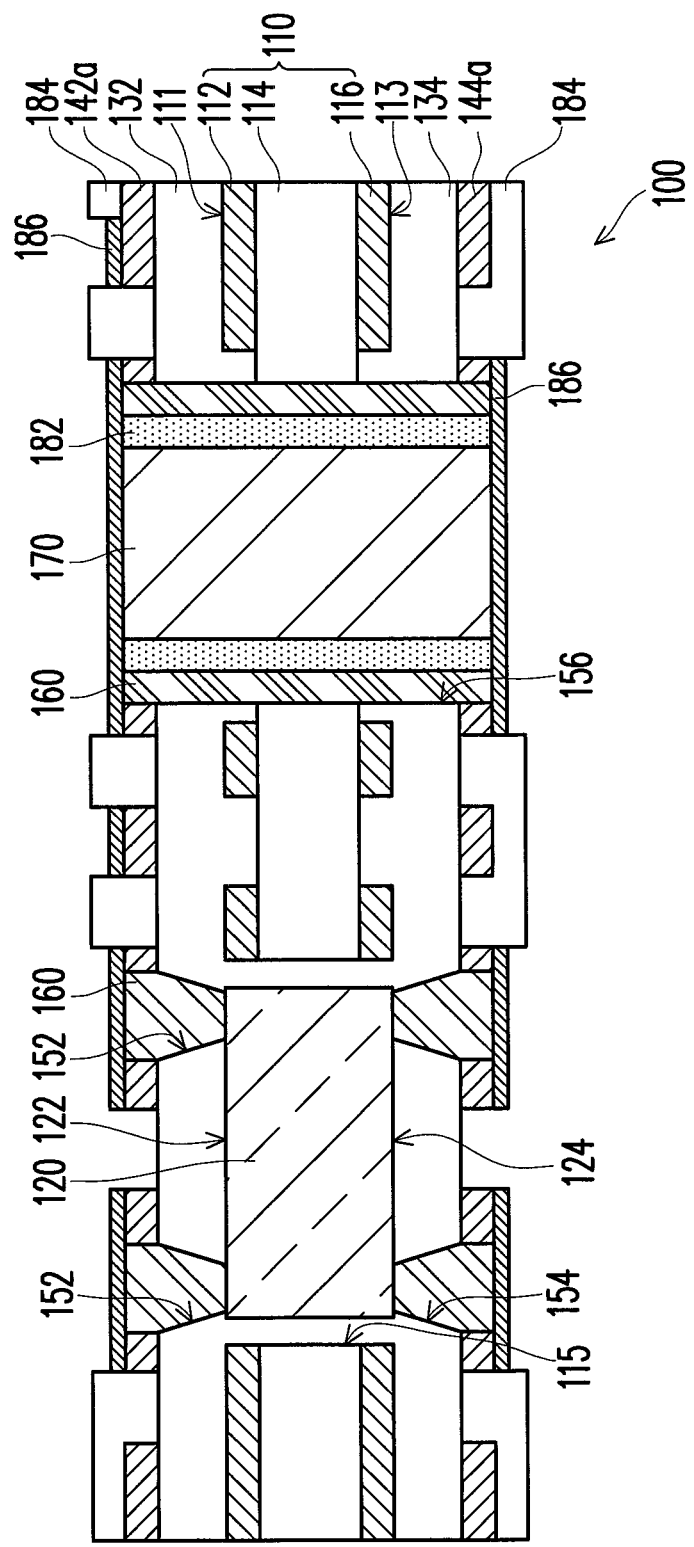

With reference to FIG. 1G, a solder mask layer 184 is disposed on a portion of the first patterned metal layer 142a, the portion of the first insulation layer 132 exposed by the first patterned metal layer 142a, a portion of the second patterned metal layer 144a, and the portion of the second insulation layer 134 exposed by the second patterned metal layer 144a. A surface passivation layer 186 is formed to cover a portion of the first patterned metal layer 142a, a portion of the second patterned metal layer 144a, the third metal layer 160, the insulation material 182, and the heat-conducting element 170. Here, the surface passivation layer 156 is, for instance, a nickel layer, a gold layer, a silver layer, a nickel palladium gold layer, or any other appropriate material layer, which should not be construed a limitation to the invention. So far, the manufacture of the package carrier 100 is substantially completed.

The electronic device 120 described in the present embodiment is disposed inside the opening 115 of the substrate 110, the first insulation layer 132 and the first patterned metal layer 142a are stacked onto the electronic device 120, and the second insulation layer 134 and the second patterned metal layer 144a are also stacked onto the electronic device 120. Namely, the electronic device 120 is embedded in the package carrier 100. Accordingly, the package carrier 100 described in the present embodiment may have small package thickness. In addition, the diameter of the opening 115 of the substrate 110 is greater than the diameter of the electronic device 120. Hence, when the electronic device 120 is disposed inside the opening 115 of the substrate 110, favorable process window can be guaranteed.

As to the structure of the package carrier 100 exemplarily shown in FIG. 1G, the package carrier 100 described in the present embodiment includes the substrate 110, the electronic device 120, the first insulation layer 132, the first patterned metal layer 142a, the second insulation layer 134, the second patterned metal layer 144a, the heat-dissipation channel 156, the third metal layer 160, and the heat-conducting element 170. The substrate 110 is composed of the first copper foil layer 112, the core dielectric layer 114, and the second copper foil layer 116. Besides, the substrate 110 has the upper surface 111, the lower surface 113 opposite to the upper surface 111, and the opening 115 communicating the upper surface 111 and the lower surface 113. The electronic device 120 is configured inside the opening 115 of the substrate 110, and the electronic device 120 has the top surface 122 and the bottom surface 124 opposite to each other. Here, the electronic device 120 is, for instance, an RF device, an active device, or a passive device. The first insulation layer 132 is disposed on the upper surface 111 of the substrate 110 and fills the opening 115. Here, the first insulation layer 132 has a plurality of first blind holes 152, and the first blind holes 152 expose a portion of the top surface 122 of the electronic device 120. The first patterned metal layer 142a is disposed on the first insulation layer 132 and exposes a portion of the first insulation layer 132. The second insulation layer 134 is disposed on the lower surface 113 of the substrate 113 and fills the opening 115. Here, the second insulation layer 134 has a plurality of second blind holes 154, and the second blind holes 154 expose a portion of the bottom surface 124 of the electronic device 120. The second patterned metal layer 144a is disposed on the second insulation layer 134 and exposes a portion of the second insulation layer 134. The heat-dissipation channel 156 penetrates the first insulation layer 132, the first patterned metal layer 142a, the substrate 110, the second patterned metal layer 144a, and the second insulation layer 134. The first blind holes 152 and the second blind holes 154 are filled with the third metal layer 160, and the third metal layer 160 covers an inner wall of the heat-dissipation channel 156. Here, the third metal layer 160 connects the first patterned metal layer 142a and the second patterned metal layer 144a. The heat-conducting device 170 is configured in the heat-dissipation channel 156 via the insulation material 182. Here, the insulation material 182 is located between the heat-conducting device 170 and a portion of the third metal layer 160, and a material of the heat-conducting device 170 is, for instance, ceramics, silicon, silicon carbide, diamond, or metal.

Besides, the package carrier 100 described in the present embodiment further includes a solder mask layer 184 and a surface passivation layer 186. The solder mask layer 184 is disposed on a portion of the first patterned metal layer 142a, the portion of the first insulation layer 132 exposed by the first patterned metal layer 142a, a portion of the second patterned metal layer 144a, and the portion of the second insulation layer 134 exposed by the second patterned metal layer 144a. The surface passivation layer 186 covers a portion of the first patterned metal layer 142a, a portion of the second patterned metal layer 144a, the third metal layer 160, and the heat-conducting device 170.

Figure 2:
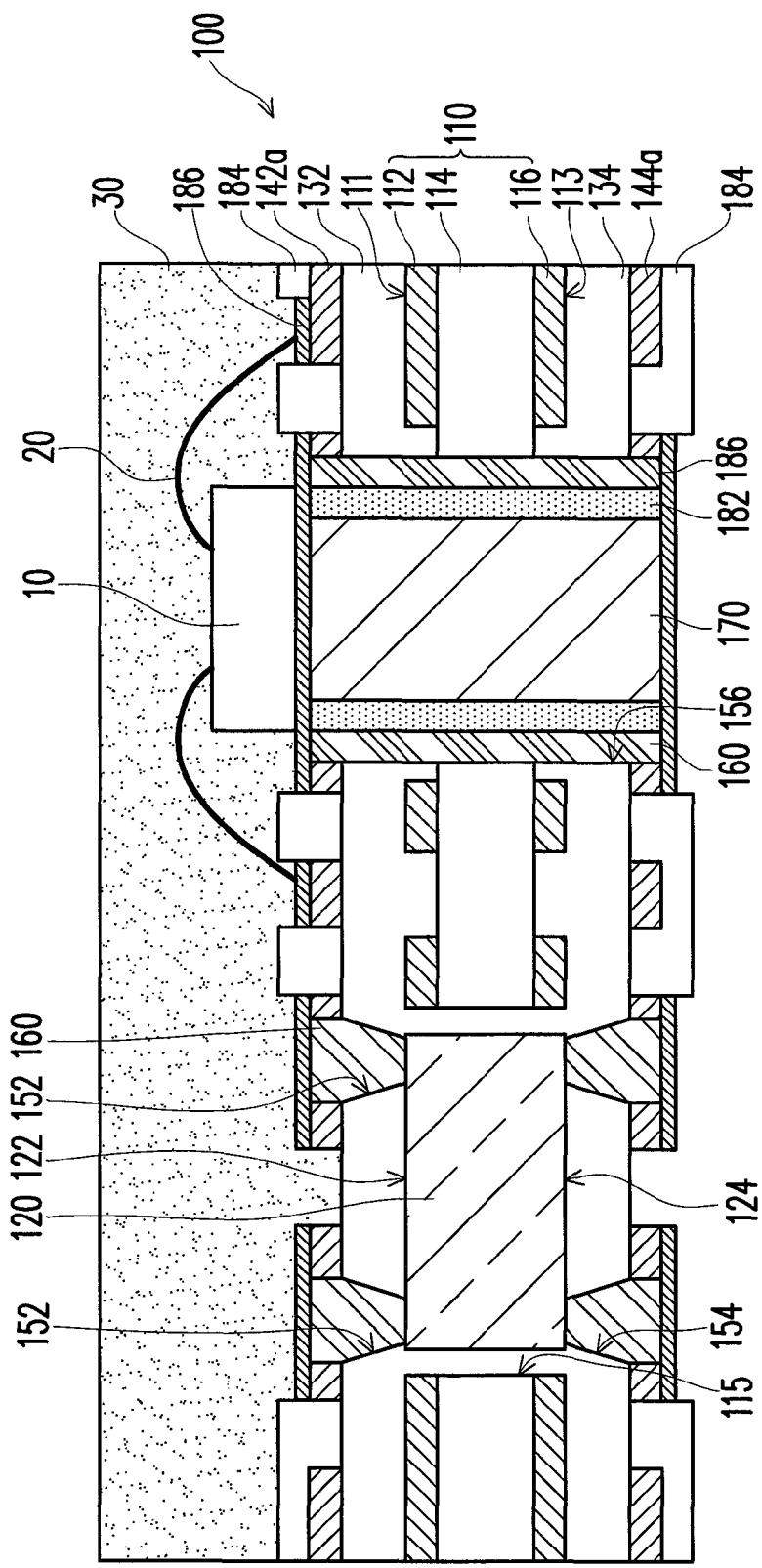
FIG. 2 is a schematic cross-sectional view illustrating that the package carrier depicted in FIG. 1G holds a heat-generating device.

FIG. 2 is a schematic cross-sectional view illustrating that the package carrier depicted in FIG. 1G holds a heat-generating device. With reference to FIG. 2, in the present embodiment, the package carrier 100 is suitable for holding a heat-generating device 10. The heat-generating device 10 is disposed on the surface passivation layer 186 corresponding to the heat-conducting device 170, and the heat-generating device 10 is, for instance, an electronic chip or an photoelectric device, which should however not be construed as a limitation to the invention. For instance, the heat-generating device 10 is a semiconductor integrated circuit (IC) chip or a light emitting diode (LED) chip, for instance, but is not limited thereto.

Specifically, the heat-generating device 10 may be electrically connected to the surface passivation layer 186 through wire bonding via a plurality of bonding wires 20. It is also likely to protect the electrical connection among the heat-generating device 10, the bonding wires 20, and the package carrier 30 with use of a molding compound to encapsulate the heat-generating device 10, the bonding wires 20, and a portion of the package carrier 30. From another aspect, when the heat-generating device 10 is configured on the package carrier 100, heat generated by the heat-generating device 10 may be rapidly transmitted to external surroundings through the heat-conducting device 170 and the surface passivation layer 186. As such, the package carrier 100 described in the present embodiment is able to effectively dissipate the heat generated by the heat-generating device 10 and further improve efficiency and extend the life span of the heat-generating device 10.

Even though the heat-generating device 10 described herein is electrically connected to the surface passivation layer 186 of the package carrier 100 through wire bonding, the way to bond the heat-generating device 10 to the package carrier 100 and the type of the heat-generating device 10 are not limited in the invention. In another embodiment, however, the heat-generating device 10 may also be electrically connected to the surface passivation layer 186 located above the heat-conducting device 170 through flip-chip bonding via a plurality of bumps (not shown). According to another embodiment, the heat-generating device 10 may be a chip package (not shown) and may be configured on the package carrier 100 through surface mount technology (SMT). The above-mentioned way to bond the heat-generating device 10 to the package carrier 100 and the aforesaid type of the heat-generating device 10 are merely exemplary and should not be construed as limitations to the invention.

In light of the foregoing, the package carrier described herein has the heat-conducting device, and the heat-conducting device is embedded in the substrate. Therefore, when a heat-generating device is configured on the package carrier, heat generated by the device may be rapidly transmitted to external surroundings through the heat-conducting device, so as to effectively dissipate the heat generated by the heat-generating device and further improve efficiency and extend the life span of the heat-generating device. Moreover, the electronic device provided in an embodiment of the invention is embedded in the substrate, and thus the package carrier described herein may have small package thickness and large layout space.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:
1. A package barrier comprising:
   a substrate having an upper surface, a lower surface opposite to the upper surface, and an opening communicating the upper surface and the lower surface;
   an electronic device disposed inside the opening of the substrate, the electronic device having a top surface and a bottom surface opposite to each other;
   a first insulation layer disposed on the upper surface of the substrate, the first insulation layer filling the opening and having a plurality of first blind holes, the first blind holes exposing a portion of the top surface of the electronic device;
   a first patterned metal layer disposed on the first insulation layer, the first patterned metal layer exposing a portion of the first insulation layer;
   a second insulation layer disposed on the lower surface of the substrate, the second insulation layer filling the opening and having a plurality of second blind holes, the second blind holes exposing a portion of the bottom surface of the electronic device;
   a second patterned metal layer disposed on the second insulation layer, the second patterned metal layer exposing a portion of the second insulation layer;
   a heat-dissipation channel penetrating the first insulation layer, the first patterned metal layer, the substrate, the second patterned metal layer, and the second insulation layer;
   a third metal layer filling the first blind holes and the second blind holes and covering an inner wall of the heat-dissipation channel, wherein the third metal layer connects the first patterned metal layer and the second patterned metal layer; and
   a heat-conducting device disposed inside the heat-dissipation channel.

2. The package carrier as recited in claim 1, further comprising:
   a solder mask layer disposed on a portion of the first patterned metal layer, the portion of the first insulation layer exposed by the first patterned metal layer, a portion of the second patterned metal layer, and the portion of the second insulation layer exposed by the second patterned metal layer; and
   a surface passivation layer covering a portion of the first patterned metal layer, a portion of the second patterned metal layer, the third metal layer, and the heat-conducting device.

3. The package carrier as recited in claim 1, wherein a material of the heat-conducting device comprises ceramics, silicon, silicon carbide, diamond, or metal.

4. The package carrier as recited in claim 1, wherein the electronic device comprises a radio frequency device, an active device, or a passive device.

5. A manufacturing method of a package carrier, the manufacturing method comprising:

providing a substrate, the substrate having an upper surface, a lower surface opposite to the upper surface, and an opening communicating the upper surface and the lower surface;

configuring an electronic device inside the opening of the substrate, the electronic device having a top surface and a bottom surface opposite to each other;

laminating a first insulation layer and a superimposed first metal layer on the upper surface of the substrate and laminating a second insulation layer and a superimposed second metal layer on the lower surface of the substrate, wherein the opening is filled with the first insulation layer and the second insulation layer;

forming a plurality of first blind holes, a plurality of second blind holes, and a heat-dissipation channel, wherein the first blind holes extend from the first metal layer to the first insulation layer and expose a portion of the top surface of the electronic device, the second blind holes extend from the second metal layer to the second insulation layer and expose a portion of the bottom surface of the electronic device, and the heat-dissipation channel penetrates the first metal layer, the first insulation layer, the substrate, the second insulation layer, and the second metal layer;

forming a third metal layer on the first blind holes, the second blind holes, and an inner wall of the heat-dissipation channel;

configuring a heat-conducting device inside the heat-dissipation channel, wherein the heat-conducting device is fixed into the heat-dissipation channel via an insulation material, and the insulation material is located between the heat-conducting device and a portion of the third metal layer located on the inner wall of the heat-dissipation channel; and patterning the first metal layer and the second metal layer to form a first patterned metal layer and a second patterned metal layer.

6. The manufacturing method of the package carrier as recited in claim 5, after patterning the first metal layer and the second metal layer, the manufacturing method further comprising:

forming a solder mask layer on a portion of the first patterned metal layer, a portion of the first insulation layer exposed by the first patterned metal layer, a portion of the second patterned metal layer, and a portion of the second insulation layer exposed by the second patterned metal layer; and forming a surface passivation layer to cover a portion of the first patterned metal layer, a portion of the second patterned metal layer, the third metal layer, the insulation material, and the heat-conducting device.

7. The manufacturing method of the package carrier as recited in claim 5, wherein the substrate comprises a first copper foil layer, a second copper foil layer, and a core dielectric layer disposed between the first copper foil layer and the second copper foil layer.

8. The manufacturing method of the package carrier as recited in claim 5, wherein a material of the heat-conducting device comprises ceramics, silicon, silicon carbide, diamond, or metal.

9. The manufacturing method of the package carrier as recited in claim 5, wherein the electronic device comprises a radio frequency device, an active device, or a passive device.

10. The manufacturing method of the package carrier as recited in claim 5, wherein a method of forming the third metal layer comprises plating.

\* \* \* \* \*